United States Patent
Yang et al.

(10) Patent No.: US 9,076,928 B2
(45) Date of Patent: Jul. 7, 2015

(54) SEMICONDUCTOR LIGHT EMITTING DEVICE AND METHOD FOR MANUFACTURING THE SAME

(71) Applicant: SAMSUNG ELECTRONICS CO., LTD., Suwon-si, Gyeonggi-do (KR)

(72) Inventors: Seong Seok Yang, Gyeonggi-do (KR); Ki Seok Kim, Gyeonggi-do (KR); Je Won Kim, Seoul (KR); Ju Bin Seo, Seoul (KR); Sang Seok Lee, Seoul (KR); Joon Sub Lee, Seoul (KR); Jin Bock Lee, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 43 days.

(21) Appl. No.: 13/906,044

(22) Filed: May 30, 2013

(65) Prior Publication Data

US 2013/0320351 A1    Dec. 5, 2013

(30) Foreign Application Priority Data

May 30, 2012    (KR) .................. 10-2012-0057550

(51) Int. Cl.
| | |
|---|---|
| H01L 33/00 | (2010.01) |
| H01L 33/36 | (2010.01) |
| H01L 33/02 | (2010.01) |
| H01L 27/15 | (2006.01) |

(52) U.S. Cl.
CPC ................ *H01L 33/36* (2013.01); *H01L 33/02* (2013.01); *H01L 27/15* (2013.01)

(58) Field of Classification Search
CPC .......... H01L 33/36; H01L 33/02; H01L 27/15
USPC .......................................................... 257/79
See application file for complete search history.

(56) References Cited

U.S. PATENT DOCUMENTS

| | | | |
|---|---|---|---|
| 5,990,499 A | 11/1999 | Kuhlmann et al. | |
| 7,772,600 B2 * | 8/2010 | Oh et al. .......................... | 257/86 |
| 2003/0122139 A1 * | 7/2003 | Meng et al. ..................... | 257/81 |
| 2003/0189201 A1 * | 10/2003 | Chen ............................... | 257/13 |
| 2004/0188719 A1 * | 9/2004 | Nawashiro et al. ............ | 257/200 |
| 2006/0056123 A1 * | 3/2006 | Aoyagi et al. .................. | 361/56 |

(Continued)

FOREIGN PATENT DOCUMENTS

| | | |
|---|---|---|
| JP | 11-507182 | 6/1999 |
| JP | 2001-223390 A | 8/2001 |

(Continued)

*Primary Examiner* — Victor A Mandala
(74) *Attorney, Agent, or Firm* — McDermott Will & Emery LLP

(57) ABSTRACT

A semiconductor light emitting device is provided and includes a protective element including a first lower conductivity-type semiconductor layer and a second lower conductivity-type semiconductor layer. First and second lower electrodes are connected to the first lower conductivity-type semiconductor layer and the second lower conductivity-type semiconductor layer, respectively. A light emitting structure includes a first upper conductivity-type semiconductor layer, an active layer, and a second upper conductivity-type semiconductor layer sequentially formed on the protective element. First and second upper electrodes are connected to the first upper conductivity-type semiconductor layer and the second upper conductivity-type semiconductor layer, respectively.

10 Claims, 6 Drawing Sheets

(56) References Cited

U.S. PATENT DOCUMENTS

| | | |
|---|---|---|
| 2006/0163604 A1* | 7/2006 | Shin et al. .................... 257/103 |
| 2007/0069218 A1* | 3/2007 | Chen et al. .................... 257/79 |
| 2011/0037088 A1 | 2/2011 | Oya et al. |
| 2011/0260210 A1* | 10/2011 | Su ................................ 257/103 |
| 2013/0313592 A1* | 11/2013 | Sugizaki et al. ................ 257/98 |

FOREIGN PATENT DOCUMENTS

| JP | 2006-086300 A | 3/2006 |
|---|---|---|
| JP | 4568379 B1 | 10/2010 |

* cited by examiner

SEMICONDUCTOR LIGHT EMITTING DEVICE AND METHOD FOR MANUFACTURING THE SAME

CROSS-REFERENCE TO RELATED APPLICATION

This application claims the priority to Korean Patent Application No. 10-2012-0057550, filed on May 30, 2012, in the Korean Intellectual Property Office, the disclosure of which is incorporated herein by reference.

TECHNICAL FIELD

The present application relates to a semiconductor light emitting device and a method for manufacturing the same.

BACKGROUND

A semiconductor light emitting device such as a light emitting diode (LED) is a device including a material that emits light through the application of electrical energy thereto, in which energy generated by electron hole recombination at semiconductor junctions is converted into light to be emitted therefrom. LEDs are commonly employed as light sources in general illumination devices, display devices, and the like, and the development of LEDs has accelerated.

Recently, the development and employment of gallium nitride-based LEDs has increased, and mobile device keypads, vehicle turn signal lamps, camera flashes, and the like, using such a gallium nitride-based LED, have been commercialized, and in line with this, the development of general illumination devices using LEDs has accelerated.

Like the products to which they are applied, such as a backlight unit of a large TV, a vehicle headlamp, a general illumination device, and the like, products in which LEDs are utilized are gradually moving toward large-sized products having high outputs and high efficiency, and thus, the characteristics of LEDs used in such products are required to satisfy the high level characteristics required of the LEDs.

SUMMARY

Current semiconductor light emitting devices include an additionally mounted Zener diode to prevent damage thereto by static electricity, which, however, disadvantageously makes a manufacturing process complicated, limits a size of the light emitting devices, and increases unit manufacturing cost. Thus, a semiconductor light emitting device having improved electrical characteristics such as high tolerance to reverse electrostatic discharge (ESD), and a method for manufacturing the same are required.

According to an aspect of the present application, there is provided a semiconductor light emitting device. The device includes a protective element including a first lower conductivity-type semiconductor layer and a second lower conductivity-type semiconductor layer, and first and second lower electrodes connected to the first lower conductivity-type semiconductor layer and the second lower conductivity-type semiconductor layer, respectively. A light emitting structure includes a first upper conductivity-type semiconductor layer, an active layer, and a second upper conductivity-type semiconductor layer sequentially formed on the protective element. First and second upper electrodes are connected to the first upper conductivity-type semiconductor layer and the second upper conductivity-type semiconductor layer, respectively.

According to another aspect of the present application, there is provided a semiconductor light emitting device. The device includes a light emitting structure including a first upper conductivity-type semiconductor layer, an active layer, a second upper conductivity-type semiconductor layer, and first and second upper electrodes connected to the first upper conductivity-type semiconductor layer and the second upper conductivity-type semiconductor layer, respectively. A protective element includes a first lower conductivity-type semiconductor layer and a second lower conductivity-type semiconductor layer sequentially formed on the light emitting structure. First and second lower electrodes are connected to the first lower conductivity-type semiconductor layer and the second lower conductivity-type semiconductor layer, respectively.

The protective element and the light emitting structure may be electrically connected to be parallel.

The protective element and the light emitting structure may be electrically connected to be parallel in a forward direction, or the protective element and the light emitting structure may be electrically connected to be parallel in a reverse direction.

An undoped semiconductor layer may be formed between the protective element and the light emitting structure.

The first lower conductivity-type semiconductor layer of the protective element and the first upper conductivity-type semiconductor layer of the light emitting structure may be formed to be in contact with each other.

The first lower conductivity-type semiconductor layer of the protective element and the first upper conductivity-type semiconductor layer of the light emitting structure may have the same composition.

According to another aspect of the present application, there is provided a method for manufacturing a semiconductor light emitting device. The method includes forming a protective element by growing a first lower conductivity-type semiconductor layer and a second lower conductivity-type semiconductor layer on a substrate. A light emitting structure is formed by sequentially growing a first upper conductivity-type semiconductor layer, an active layer, and a second upper conductivity-type semiconductor layer on the protective element. The first lower conductivity-type semiconductor layer is etched so as to be exposed. The second lower conductivity-type semiconductor layer is etched so as to be exposed. The first upper conductivity-type semiconductor layer is etched so as to be exposed. A first lower electrode, a second lower electrode, a first upper electrode, and a second upper electrode are disposed on the exposed first lower conductivity-type semiconductor layer, the exposed second lower conductivity-type semiconductor layer, the exposed first upper conductivity-type semiconductor layer, and the second upper conductivity-type semiconductor layer, respectively.

According to yet another aspect of the present application, there is provided a method for manufacturing a semiconductor light emitting device. The method includes forming a light emitting structure by sequentially growing a first lower conductivity-type semiconductor layer, an active layer, and a second lower conductivity-type semiconductor layer on a substrate. A protective element is formed by growing a first upper conductivity-type semiconductor layer and a second upper conductivity-type semiconductor layer on the light emitting structure. The first lower conductivity-type semiconductor layer is etched so as to be exposed. The second lower conductivity-type semiconductor layer is etched so as to be exposed. The first upper conductivity-type semiconductor layer is etched so as to be exposed. A first lower electrode, a second lower electrode, a first upper electrode, and a second upper electrode are disposed on the exposed first lower conductivity-type semiconductor layer, the exposed second lower conductivity-type semiconductor layer, the exposed first upper conductivity-type semiconductor layer, and the second upper conductivity-type semiconductor layer, respectively.

The light emitting structure may be directly grown on the protective element, or the protective element may be directly grown on the light emitting structure.

In the forming of the protective element, after the first lower conductivity-type semiconductor layer is grown, the second lower conductivity-type semiconductor layer may be grown.

In the forming of the protective element, after the second lower conductivity-type semiconductor layer is grown, the first lower conductivity-type semiconductor layer may be grown.

The method may further include: after the forming of the first lower electrode, the second lower electrode, the first upper electrode, and the second upper electrode, electrically connecting the first lower electrode and the second upper electrode and electrically connecting the second lower electrode and the first upper electrode.

The method may further include: after the forming of the first lower electrode, the second lower electrode, the first upper electrode, and the second upper electrode, electrically connecting the second upper electrode and the second lower electrode and electrically connecting the first upper electrode and the first lower electrode.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The above and other aspects, features and other advantages of the present application will be more clearly understood from the following detailed description taken in conjunction with the accompanying drawings, in which.

DETAILED DESCRIPTION

Figure 1A:
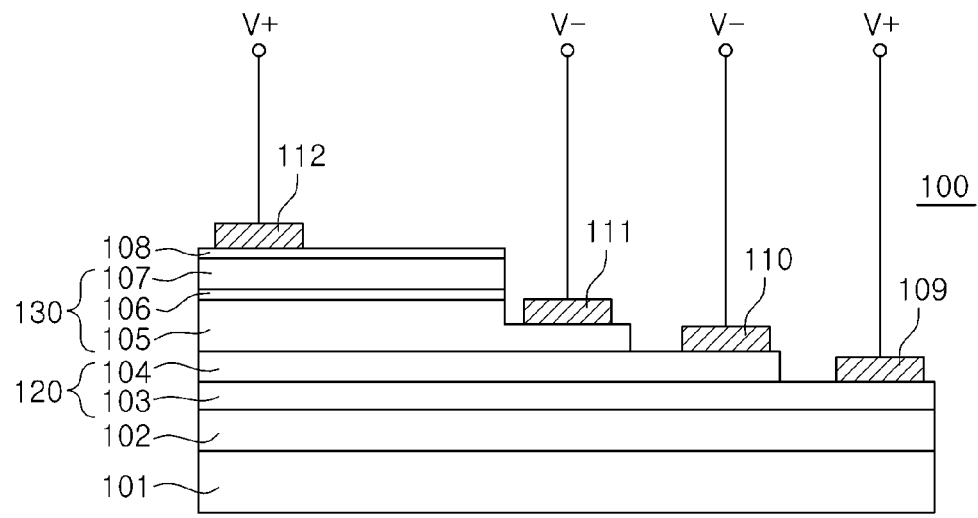
FIG. 1A is a cross-sectional view schematically illustrating a semiconductor light emitting device according to an embodiment of the present invention.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

In the drawings, the shapes and dimensions of elements may be exaggerated for clarity, and the same reference numerals will be used throughout to designate the same or like components.

Figure 1B:
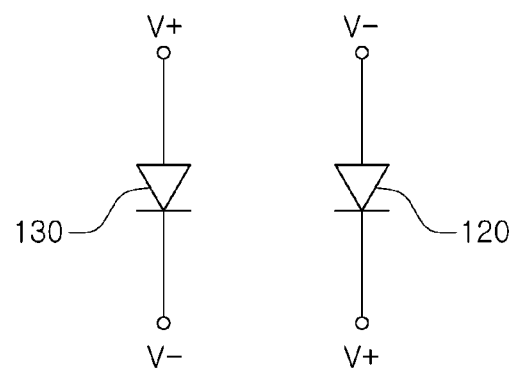
FIG. 1B is an equivalent circuit diagram of the semiconductor light emitting device of FIG. 1A.

FIG. 1A is a cross-sectional view schematically illustrating a semiconductor light emitting device according to an example of the present application, and FIG. 1B is an equivalent circuit diagram of the semiconductor light emitting device of FIG. 1A.

As illustrated in FIG. 1A, a semiconductor light emitting device 100 includes a protective element 120 formed on a substrate 101 and a light emitting structure 130 formed on the protective element 120.

As the substrate 101, any one of a sapphire, a silicon carbide (SiC), a silicon (Si), an $MgAl_2O_4$, an MgO, an $LiAlO_2$, an $LiGaO_2$ and a GaN substrate may be used, but the present application is not limited thereto. In the present example, a sapphire substrate is used.

The protective element 120 includes a first lower conductivity type semiconductor layer 103 and a second lower conductivity type semiconductor layer 104 sequentially stacked on the substrate 101, and first and second lower electrodes 109 and 110 formed on the first lower conductivity type semiconductor layer 103 and the second lower conductivity type semiconductor layer 104, respectively.

The first lower conductivity-type semiconductor layer 103 and the second lower conductivity-type semiconductor layer 104 may be nitride semiconductor layers. The first lower conductivity-type semiconductor layer 103 may include an n-type semiconductor layer, and the second lower conductivity-type semiconductor layer 104 may include a p-type semiconductor layer.

The n-type semiconductor layer and the p-type semiconductor layer may be made of a semiconductive material doped with an n-type impurity and a p-type impurity having an empirical formula $Al_xIn_yGa_{(1-x-y)}N$, and the semiconductive material may be, typically, GaN, AlGaN, and InGaN. Here, the x and y values may be within the range of $0 \leq x \leq 1$, $0 \leq y \leq 1$, and $0 \leq x+y \leq 1$.

Silicon (Si), germanium (Ge), selenium (Se), tellurium (Te), carbon (C), or the like, may be used as the n-type impurity, and manganese (Mg), zinc (Zn), beryllium (Be), or the like, may be used as the p-type impurity.

In the present example, GaN layers may be used as the first lower conductivity-type semiconductor layer 103 and the second lower conductivity-type semiconductor layer 104. In particular, an n-GaN layer may be used as the first lower conductivity-type semiconductor layer 103 and a p-GaN layer may be used as the second lower conductivity-type semiconductor layer 104.

The first lower conductivity-type semiconductor layer 103 and the second lower conductivity-type semiconductor layer 104 may be grown through metal-organic chemical vapor deposition (MOCVD), molecular beam epitaxy (MBE), hydride vapor phase epitaxy (HVPE), or the like.

The first and second lower electrodes 109 and 110 are formed on the first lower conductivity-type semiconductor layer 103 and the second lower conductivity-type semiconductor layer 104, respectively. When power is applied to the first lower conductivity-type semiconductor layer 103 and the second lower conductivity-type semiconductor layer 104, a p-n junction is formed at the boundary between the first lower conductivity-type semiconductor layer 103 and the second lower conductivity-type semiconductor layer 104. Therefore the protection element 120 operates like a P-N diode.

Also, an undoped-GaN layer may be formed as a buffer layer 102 under the first lower conductivity-type semiconductor layer 103.

The light emitting structure 130 is formed on the protective element 120. The light emitting structure 130 may be formed by directly growing a semiconductor layer on the second lower conductivity-type semiconductor layer 104 of the protective element 120, or may be formed by forming undoped-GaN on the protective element 120 and subsequently growing a semiconductor layer thereon.

The light emitting structure 130 is formed by sequentially stacking a first upper conductivity-type semiconductor layer 105, an active layer 106, and a second upper conductivity-type semiconductor layer 107 on the protective element 120 or the undoped-GaN.

As described above, the light emitting structure 130 may be a nitride semiconductor layer similar to the first lower conductivity-type semiconductor layer 103 and the second lower conductivity-type semiconductor layer 104 of the protective element 120. The first upper conductivity-type semiconductor layer 105 may include an n-type semiconductor layer and the second upper conductivity-type semiconductor layer may include a p-type semiconductor layer. Also, the n-type semiconductor layer and the p-type semiconductor layer may be made of a semiconductive material doped with an n-type impurity and a p-type impurity having an empirical formula $Al_xIn_yGa_{(1-x-y)}N$, and the semiconductive material may be, typically, GaN, AlGaN, and InGaN. Here, the x and y values may be within the range of $0 \leq x \leq 1$, $0 \leq y \leq 1$, and $0 \leq x+y \leq 1$. Also, silicon (Si), germanium (Ge), selenium (Se), tellurium (Te), carbon (C), or the like, may be used as the n-type impurity Manganese (Mg), zinc (Zn), beryllium (Be), or the like, may be used as the p-type impurity.

In the present example, GaN layers may be used as the first upper conductivity-type semiconductor layer 105 and the second upper conductivity-type semiconductor layer 107. In particular, a n-GaN layer may be used as the first upper conductivity-type semiconductor layer 105 and a p-GaN layer may be used as the second upper conductivity-type semiconductor layer 107.

Also, a transparent electrode layer 108 made of nickel/gold (Ni/Au) or indium tin oxide (ITO) may be formed on the second upper conductivity-type semiconductor layer 107.

The active layer 106 may be a layer emitting visible light (having a wavelength range of about 350 nm to 680 nm), or may be configured as an undoped nitride semiconductor layer having a single or multi-quantum well (MQW) structure. The active layer 122 may have an MQW structure in which quantum well layers and quantum barrier layers are alternately laminated. For example, the active layer 106 has a MQW structure in which quantum barrier layers and quantum well layers of $Al_xIn_yGa_{(1-x-y)}N$ ($0 \leq x \leq 1$, $0 \leq y \leq 1$, $0 \leq x+y \leq 1$) are alternately laminated to have a certain band gap, and electrons and holes are recombined by the quantum wells to emit light.

An electrode to which power is applied is disposed on the light emitting structure 130. After the second upper conductivity-type semiconductor layer 107 and the active layer 106 are mesa-etched such that the first upper conductivity-type semiconductor layer 105 of the light emitting structure 130 is exposed, a second upper electrode 112 is formed on an upper portion of the second upper conductivity-type semiconductor layer 107, and a first upper electrode 111 is formed on an upper portion of the first upper conductivity-type semiconductor layer 105 exposed as the second upper conductivity-type semiconductor layer 107 and the active layer 106 were mesa-etched. Power is applied to the light emitting structure 130 through the first and second upper electrodes 111 and 112.

Also, after the second lower conductivity-type semiconductor layer 104 and the first lower conductivity-type semiconductor layer 103 of the protective element 120 are mesa-etched to be exposed, the second electrode 110 and the first electrode 109 are formed on the second lower conductivity-type semiconductor layer 104 and the first lower conductivity-type semiconductor layer 103, respectively. Power is applied to the protective element 120 through the first and second lower electrodes 109 and 110.

The first and second lower electrodes 109 and 110 and the first and second upper electrodes 111 and 112 may be formed as a single layer or a plurality of layers made of a material selected from the group consisting of nickel (Ni), gold (Au), silver (Ag), titanium (Ti), chromium (Cr), and copper (Cu), and may be formed through a known deposition process such as chemical vapor deposition (CVD), E-beam evaporation, or the like. Alternatively, a sputtering process, or the like may be used.

In the semiconductor light emitting device 100 having the foregoing configuration, since the light emitting structure 130 is directly grown on the protective element 120, the protective element 120 and the light emitting structure 130 may be formed through a single semiconductor growth process. Thus, the manufacturing process is simplified and costs are reduced, compared with an existing method of connecting a Zener diode to a light emitting device in parallel.

The protective element 120 and the light emitting structure 130 may be connected in parallel in a reverse or a forward direction according to a method of electrically connecting the first and second lower electrodes 109 and 110 and the first and second upper electrodes 111 and 112 of the semiconductor light emitting device 100.

Hereinafter, a process of connecting the respective electrodes of the semiconductor light emitting device and protecting the light emitting structure 130 by the protective element 120 against a reverse electrostatic-discharge (ESD) voltage will be described.

In general, a semiconductor light emitting device such as a light emitting diode (LED) is made of a material with a high energy band gap but is vulnerable to ESD due to crystal defects, or the like. In particular, the semiconductor light emitting device is more vulnerable to a reverse ESD voltage than to a forward ESD voltage. Due to such characteristics of the semiconductor light emitting device, a life span of the semiconductor light emitting device may be sharply reduced to thereby degrade product reliability. Thus, in an effort to solve this problem, a protective element such as a Zener diode is connected in parallel to protect the light emitting device against a reverse ESD voltage. However, with this method, a separate Zener diode sis required and mounted in parallel with the light emitting device, thereby complicating the process and driving up manufacturing costs. Thus, in order to solve the problem, in the present example, the protective element is integrally formed with the light emitting structure.

Figure 2A:
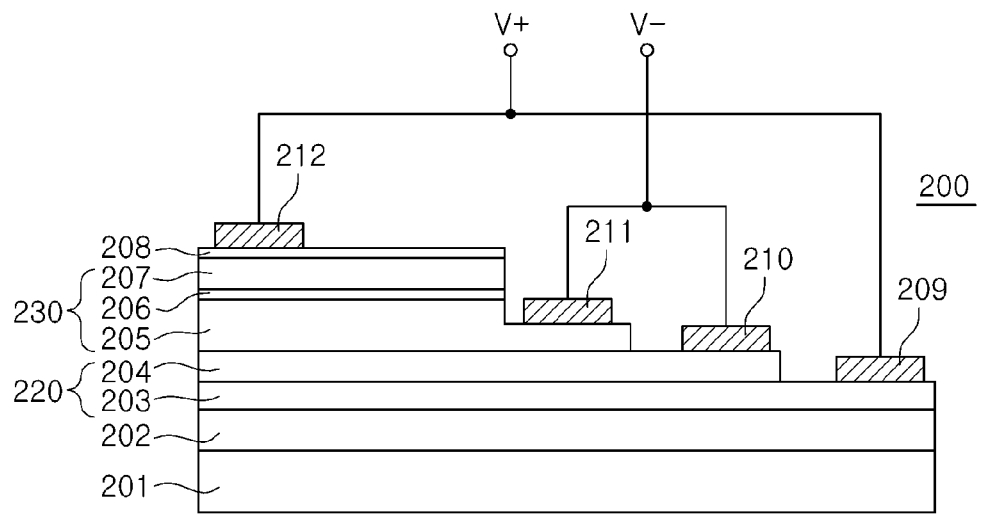
FIG. 2A is a cross-sectional view schematically illustrating a semiconductor light emitting device according to another embodiment of the present invention.
Figure 2B:
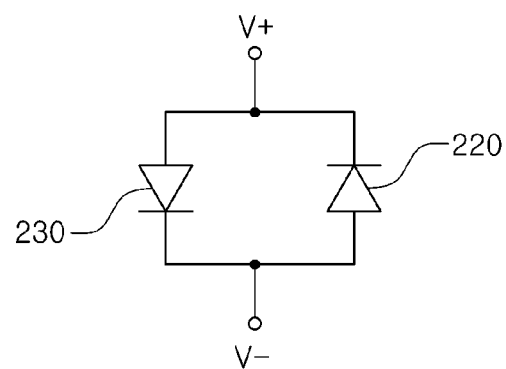
FIG. 2B is an equivalent circuit diagram of the semiconductor light emitting device of FIG. 2A.

FIG. 2A is a cross-sectional view schematically illustrating a semiconductor light emitting device 200 according to another example of the present application, and FIG. 2B is an equivalent circuit diagram of the semiconductor light emitting device 200 of FIG. 2A.

As illustrated in FIG. 2A, in a state in which a second upper electrode 212 and a first lower electrode 209 are electrically connected, and a first upper electrode 211 and a second lower electrode 210 are electrically connected, when voltages V+ and V− are applied to the respective electrodes, the equivalent circuit illustrated in FIG. 2B is formed.

The circuit has a structure in which a protective element 220 is connected to a light emitting structure 230 in parallel in a reverse direction. In general, the voltage V+ is higher than the voltage V−, so a forward voltage is applied to the light emitting structure 230 to turn it on, and a reverse voltage is applied to the protective element 220 to turn it off. Accordingly, a current barely flows through the protective element 220. When ESD occurs so that a reverse voltage is applied, a forward voltage is applied to the protective element 220 to turn it on, and thus, a reverse current mostly flows through the protective element 220, preventing damage to the light emitting structure 230 due to reverse ESD voltage.

Figure 3A:
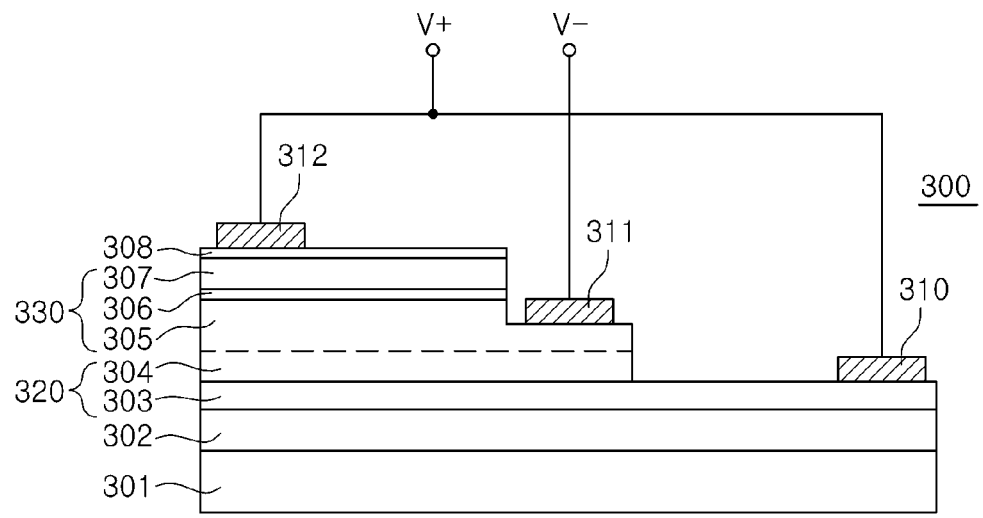
FIG. 3A is a cross-sectional view schematically illustrating a semiconductor light emitting device according to another embodiment of the present invention.
Figure 3B:
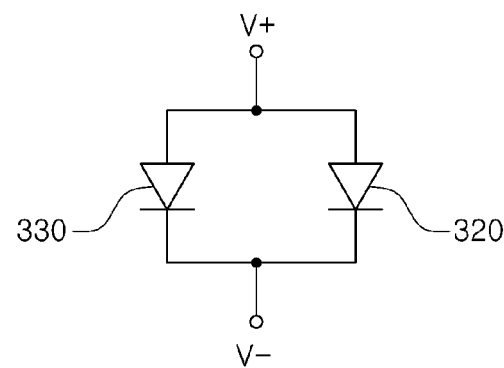
FIG. 3B is an equivalent circuit diagram of the semiconductor light emitting device of FIG. 3A.

FIG. 3A is a cross-sectional view schematically illustrating a semiconductor light emitting device 300 according to another example of the present application. The semiconductor light emitting device 300 has the same configuration as that of the former example, except that the first lower conductivity-type semiconductor layer 203 and the second lower conductivity-type semiconductor layer 204 of the protective element 220 according to the example illustrated in FIG. 2A are interchanged in stacking order. FIG. 3B is an equivalent circuit diagram of the semiconductor light emitting device 300 of FIG. 3A.

As illustrated in FIG. 3A, when the stacking order of the second lower conductivity-type semiconductor layer 303 and the first lower conductivity-type semiconductor layer 304 is changed, the first upper conductivity-type semiconductor layer 305 of a light emitting structure 330 is stacked on the first lower conductivity-type semiconductor layer 304 of a protective element 320.

Thus, when the first lower conductivity-type semiconductor layer 304 and the first upper conductivity-type semiconductor layer 305 are formed to have the same composition, the first lower conductivity-type semiconductor layer 304 and the first upper conductivity-type semiconductor layer 305 may be formed as a single integrated layer. In the present example, the case in which the first lower conductivity-type semiconductor layer 304 and the first upper conductivity-type semiconductor layer 305 are formed as a single integrated semiconductor layer will be described as an example.

Also, when the first lower conductivity-type semiconductor layer 304 and the first upper conductivity-type semiconductor layer 305 are formed as a single integrated semiconductor layer, a first lower electrode of the first lower conductivity-type semiconductor layer 304 may be omitted and a first upper electrode 311 may serve as the first lower electrode.

As illustrated in FIG. 3A, after the second upper electrode 312 and the second lower electrode 310 are electrically connected, when a voltage V+ is applied thereto and a voltage V− is applied to the first upper electrode 311, the equivalent circuit illustrated in FIG. 3B is formed.

The circuit has a structure in which the light emitting structure 330 and the protective element 320 are connected in parallel in a forward direction. In general, the voltage V+ is higher than the voltage V−, so a forward voltage is applied to the light emitting structure 330 to turn it on and a forward voltage is also applied to the protective element 320 to allow the protective element 220 to serve as a general rectifier. When ESD occurs and a reverse voltage is applied, a reverse voltage is applied to the protective element 320 to allow the protective element 320 to serve as a Zener diode.

Namely, when a reverse voltage is applied to the protective element 320, the protective element 320 operates in a breakdown mode, and breakdown may occur even at a reverse voltage of about 10V. Thus, when an instantaneous reverse ESD voltage of tens of V is applied to the protective element 320, the protective element 320 operates in a breakdown region, being in a conductive state. Accordingly, the abnormal reverse current mostly flows through the protective element 320 without passing through the light emitting structure 330. Thus, the light emitting structure 330 can be protected against reverse ESD.

Figure 4A:
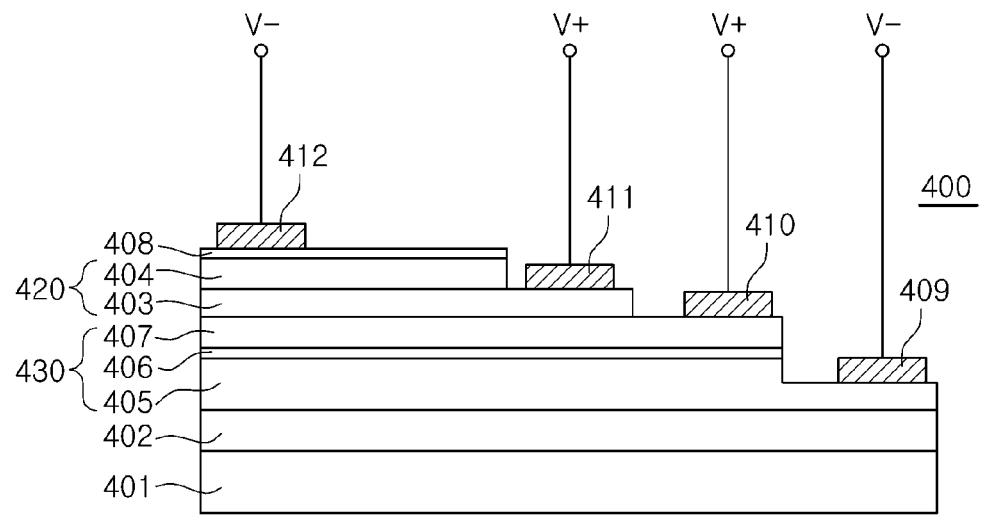
FIG. 4A is a cross-sectional view schematically illustrating a semiconductor light emitting device according to another embodiment of the present invention.
Figure 4B:
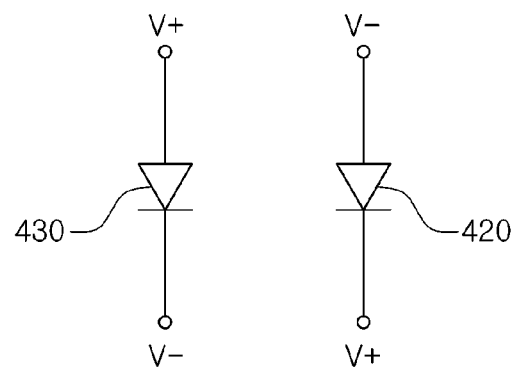
FIG. 4B is an equivalent circuit diagram of the semiconductor light emitting device of FIG. 4A.

FIG. 4A is a cross-sectional view schematically illustrating a semiconductor light emitting device 400 according to another example of the present application. The semiconductor light emitting device 400 has the same configuration as that of the former example, except that the protective element 120 and the light emitting structure 130 according to the embodiment illustrated in FIG. 1A are interchanged in stacking order. FIG. 4B is an equivalent circuit diagram of the semiconductor light emitting device 400 of FIG. 4A.

In comparison to the foregoing example in which the protective element is formed on the substrate, in the present example, a light emitting structure 430 is formed on a substrate 401 and a protective element 420 is formed on the light emitting structure 430. In this manner, in a case in which the light emitting structure 430 is first formed, when the semiconductor light emitting device 400 is mounted as a flip-chip, the light emitting structure 430 is placed on an upper portion of the protective element 420, light from the light emitting structure 430 can be advantageously emitted directly to the substrate 401, without passing through the protective element 420. Thus, when the semiconductor light emitting device 400 is applied as a flip-chip, its light extraction efficiency can be enhanced in comparison to the foregoing embodiment.

Figure 5A:
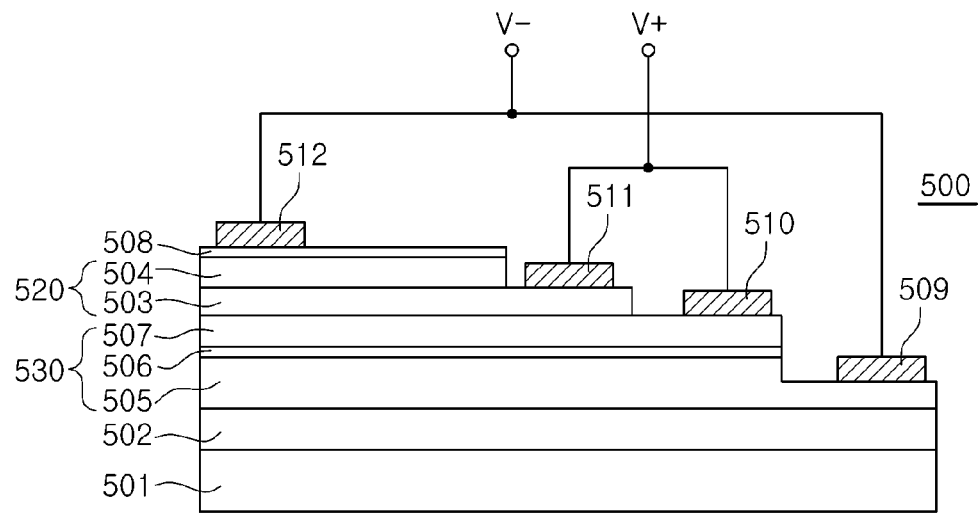
FIG. 5A is a cross-sectional view schematically illustrating a semiconductor light emitting device according to another embodiment of the present invention.
Figure 5B:
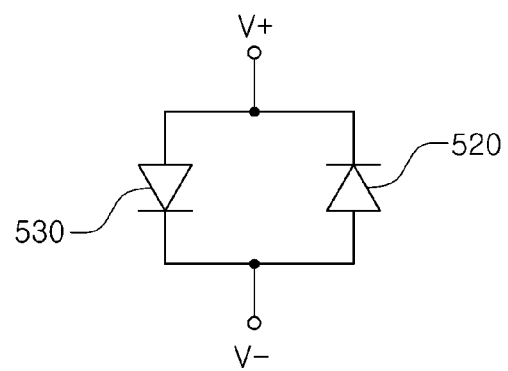
FIG. 5B is an equivalent circuit diagram of the semiconductor light emitting device of FIG. 5A.

FIG. 5A is a cross-sectional view schematically illustrating a semiconductor light emitting device 500 according to another example of the present application, and FIG. 5B is an equivalent circuit diagram of the semiconductor light emitting device 500 of FIG. 5A. The semiconductor light emitting device 500 has the same structure as that of the semiconductor light emitting device 400 illustrated in FIG. 4A, except that after a second upper electrode 512 and a first lower electrode 509 are electrically connected and a first upper electrode 511 and a second lower electrode 510 are electrically connected, voltages V− and V+ are applied.

Thus, in the present example, when the semiconductor light emitting device 500 is applied as a flip-chip, since a light emitting structure 530 is placed on top of a protective element 520, light from the light emitting structure 530 can be emitted directly to a substrate 501, without passing through the protective element 520. Thus, when the semiconductor light emitting device 500 is applied as a flip-chip, light extraction efficiency thereof can be enhanced.

Also, the circuit has a structure in which a protective element 520 is connected to a light emitting structure 530 in parallel in a reverse direction. In general, the voltage V+ is higher than the voltage V−, so a forward voltage is applied to the light emitting structure 530 to turn it on and a reverse voltage is applied to the protective element 520 to turn it off, and accordingly, a current barely flows through the protective element 520. When ESD occurs and a reverse voltage is applied, a forward voltage is applied to the protective element 520 to turn it on, and thus, a reverse current mostly flows through the protective element 520, preventing damage to the light emitting structure 530 due to reverse ESD voltage.

Figure 6A:
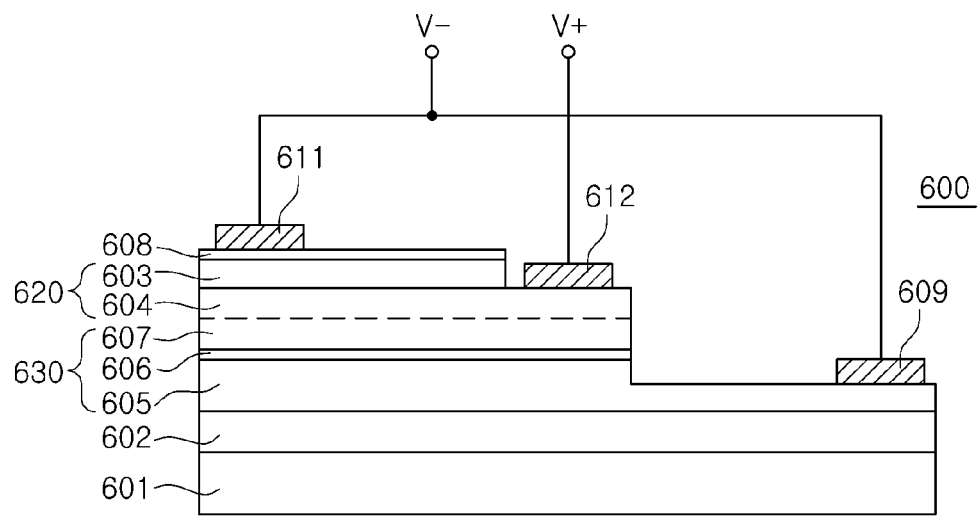
FIG. 6A is a cross-sectional view schematically illustrating a semiconductor light emitting device according to another embodiment of the present invention.
Figure 6B:
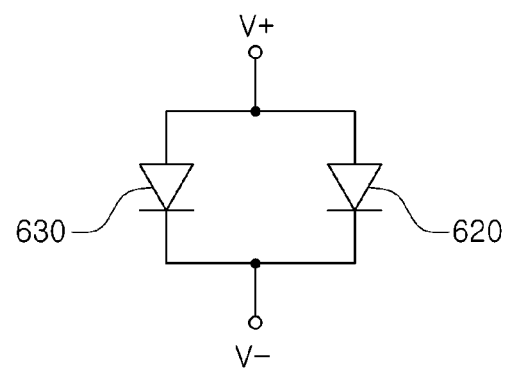
FIG. 6B is an equivalent circuit diagram of the semiconductor light emitting device of FIG. 6A.

FIG. 6A is a cross-sectional view schematically illustrating a semiconductor light emitting device according to yet another example of the present application, and FIG. 6B is an equivalent circuit diagram of the semiconductor light emitting device of FIG. 6A. The semiconductor light emitting device 600 has the same structure as that of the semiconductor light emitting device 400 illustrated in FIG. 4A, except that the second upper conductivity-type semiconductor layer 604 and the first upper conductivity-type semiconductor layer 603 are interchanged in stacking order.

When the stacking order of the second upper conductivity-type semiconductor layer 604 and the first upper conductivity-type semiconductor layer 603 of a protective element 620 is changed, the second upper conductivity-type semiconductor layer 604 of the protective element 620 is stacked on the second lower conductivity-type semiconductor layer 607 of a light emitting structure 630.

Thus, when the second upper conductivity-type semiconductor layer 604 of the protective element 620 and the second lower conductivity-type semiconductor layer 607 of the light emitting structure 630 are formed to have the same composition, the second upper conductivity-type semiconductor layer 604 and the second lower conductivity-type semiconductor layer 607 may be formed as a single integrated layer. In the present embodiment, the case in which the second lower conductivity-type semiconductor layer 607 and the second upper conductivity-type semiconductor layer 604 are formed as a single integrated semiconductor layer will be described as an example.

Also, when the second upper conductivity-type semiconductor layer 604 and the second lower conductivity-type semiconductor layer 607 are formed as a single integrated semiconductor layer, a second lower electrode of the second lower conductivity-type semiconductor layer 607 may be omitted and a second upper electrode 612 may serve as a first lower electrode.

After the first upper electrode 611 and the first lower electrode 609 are electrically connected, when a voltage V+ is applied thereto and a voltage V− is applied to the second upper electrode 612, the equivalent circuit illustrated in FIG. 6B is formed.

The circuit has a structure in which the light emitting structure 630 and the protective element 620 are connected in parallel in a forward direction. In general, the voltage V+ is higher than the voltage V−, so a forward voltage is applied to the light emitting structure 630 to turn it on and a forward voltage is also applied to the protective element 620 to allow the protective element 620 to serve as a general rectifier. When ESD occurs and a reverse voltage is applied, a reverse voltage is applied to the protective element 620 to allow the protective element 620 to serve as a Zener diode.

Namely, when a reverse voltage is applied to the protective element 620, the protective element 620 operates in a breakdown mode, and breakdown may occur even at a reverse voltage of about 10V. Thus, when an instantaneous reverse ESD voltage of tens of V is applied to the protective element 620, the protective element 620 operates in a breakdown region, being in a conductive state. Accordingly, the abnormal reverse current mostly flows through the protective element 620 without passing through the light emitting structure 630. Thus, the light emitting structure 630 can be protected against reverse ESD.

As set forth above, according to embodiments of the invention, electrical characteristics, such as tolerance to static electricity, of the semiconductor light emitting device are improved, and thus, the light emitting device secures reliability and can be easily manufactured.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A semiconductor light emitting device, comprising:
   a protective element including:
      a first lower conductivity-type semiconductor layer and a second lower conductivity-type semiconductor layer, and
      first and second lower electrodes connected to the first lower conductivity-type semiconductor layer and the second lower conductivity-type semiconductor layer, respectively; and
   a light emitting structure including:
      a first upper conductivity-type semiconductor layer, an active layer, and a second upper conductivity-type semiconductor layer sequentially formed on the protective element; and
      first and second upper electrodes connected to the first upper conductivity-type semiconductor layer and the second upper conductivity-type semiconductor layer, respectively,
   wherein the first and second upper and lower conductivity-type semiconductor layers are nitride semiconductor layers.

2. The semiconductor light emitting device of claim 1, wherein the protective element and the light emitting structure are electrically connected to be parallel.

3. The semiconductor light emitting device of claim 1, wherein the protective element and the light emitting structure are electrically connected to be parallel in a forward direction.

4. The semiconductor light emitting device of claim 1, wherein the protective element and the light emitting structure are electrically connected to be parallel in a reverse direction.

5. The semiconductor light emitting device of claim 1, wherein an undoped semiconductor layer is formed between the protective element and the light emitting structure.

6. The semiconductor light emitting device of claim 1, wherein the first lower conductivity-type semiconductor layer of the protective element and the first upper conductivity-type semiconductor layer of the light emitting structure are formed in contact with each other.

7. The semiconductor light emitting device of claim 1, wherein the nitride semiconductor layers are GaN layers.

8. The semiconductor light emitting device of claim 1, further comprising a transparent electrode layer disposed on the light emitting structure.

9. A semiconductor light emitting device comprising:
a protective element including:
- a first lower conductivity-type semiconductor layer and a second lower conductivity-type semiconductor layer, and
- first and second lower electrodes connected to the first lower conductivity-type semiconductor layer and the second lower conductivity-type semiconductor layer, respectively; and a light emitting structure including:
- a first upper conductivity-type semiconductor layer, an active layer, and a second upper conductivity-type semiconductor layer sequentially formed on the protective element; and
- first and second upper electrodes connected to the first upper conductivity-type semiconductor layer and the second upper conductivity-type semiconductor layer, respectively, wherein the first lower conductivity-type semiconductor layer of the protective element and the first upper conductivity-type semiconductor layer of the light emitting structure are formed in contact with each other, and wherein the first lower conductivity-type semiconductor layer of the protective element and the first upper conductivity-type semiconductor layer of the light emitting structure have the same composition.

10. The semiconductor light emitting device of claim 9, wherein the first lower conductivity-type semiconductor layer of the protective element and the first upper conductivity-type semiconductor layer of the light emitting structure form a single integrated semiconductor layer.

* * * * *